United States Patent
Yeh et al.

(10) Patent No.: US 12,094,828 B2
(45) Date of Patent: Sep. 17, 2024

(54) ECCENTRIC VIA STRUCTURES FOR STRESS REDUCTION

(71) Applicant: Taiwan Semiconductor Manufacturing Co., Ltd., Hsinchu (TW)

(72) Inventors: Shu-Shen Yeh, Taoyuan (TW); Che-Chia Yang, Taipei (TW); Chia-Kuei Hsu, Hsinchu (TW); Po-Yao Lin, Zhudong Township (TW); Shin-Puu Jeng, Hsinchu (TW); Chia-Hsiang Lin, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 50 days.

(21) Appl. No.: 17/126,881

(22) Filed: Dec. 18, 2020

(65) Prior Publication Data
US 2022/0020693 A1    Jan. 20, 2022

Related U.S. Application Data

(60) Provisional application No. 63/053,317, filed on Jul. 17, 2020.

(51) Int. Cl.
*H01L 23/538* (2006.01)
*H01L 21/48* (2006.01)
(Continued)

(52) U.S. Cl.
CPC ...... *H01L 23/5384* (2013.01); *H01L 21/4853* (2013.01); *H01L 21/486* (2013.01);
(Continued)

(58) Field of Classification Search
CPC ............. H01L 23/5384; H01L 21/4853; H01L 21/486
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |

(Continued)

FOREIGN PATENT DOCUMENTS

| | | |
|---|---|---|
| CN | 1276090 A | 12/2000 |
| CN | 101211914 A | 7/2008 |

(Continued)

OTHER PUBLICATIONS

Wikipedia, "Oval", Oct. 18, 2022, 4 pages.

*Primary Examiner* — Errol V Fernandes
(74) *Attorney, Agent, or Firm* — Slater Matsil, LLP

(57) ABSTRACT

A method includes forming a first dielectric layer, forming a first redistribution line including a first via extending into the first dielectric layer, and a first trace over the first dielectric layer, forming a second dielectric layer covering the first redistribution line, and patterning the second dielectric layer to form a via opening. The first redistribution line is revealed through the via opening. The method further includes depositing a conductive material into the via opening to form a second via in the second dielectric layer, and a conductive pad over and contacting the second via, and forming a conductive bump over the conductive pad. The conductive pad is larger than the conductive bump, and the second via is offset from a center line of the conductive bump.

20 Claims, 17 Drawing Sheets

(51) Int. Cl.
*H01L 21/768* (2006.01)
*H01L 23/00* (2006.01)

(52) U.S. Cl.
CPC .... *H01L 21/76802* (2013.01); *H01L 23/5385* (2013.01); *H01L 23/5386* (2013.01); *H01L 24/14* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,640,498 B1 | 5/2017 | Huang et al. | |
| 9,741,690 B1 | 8/2017 | Hsieh et al. | |
| 9,773,753 B1 | 9/2017 | Lin et al. | |
| 9,812,414 B1* | 11/2017 | Lin | H01L 24/05 |
| 10,062,648 B2 | 8/2018 | Hsieh et al. | |
| 10,157,871 B1* | 12/2018 | Yu | H01L 24/14 |
| 10,204,852 B2 | 2/2019 | Hsu et al. | |
| 10,475,768 B2 | 11/2019 | Hsieh et al. | |
| 10,522,488 B1 | 12/2019 | Chen et al. | |
| 10,566,288 B2 | 2/2020 | Kao et al. | |
| 10,629,560 B2 | 4/2020 | Chen et al. | |
| 11,101,209 B2 | 8/2021 | Liu et al. | |
| 11,264,359 B2 | 3/2022 | Hsu et al. | |
| 11,508,656 B2 | 11/2022 | Pan et al. | |
| 11,508,695 B2 | 11/2022 | Hsieh et al. | |
| 11,527,474 B2 | 12/2022 | Tsai et al. | |
| 11,749,644 B2 | 9/2023 | Hsu et al. | |
| 2004/0040855 A1 | 3/2004 | Batinovich | |
| 2005/0046041 A1* | 3/2005 | Tsai | H01L 25/16 |
| | | | 257/778 |
| 2006/0076679 A1 | 4/2006 | Batchelor et al. | |
| 2007/0182004 A1 | 8/2007 | Rinne | |
| 2008/0157913 A1 | 7/2008 | Kim | |
| 2009/0184424 A1 | 7/2009 | Furusawa et al. | |
| 2009/0278263 A1 | 11/2009 | McCarthy et al. | |
| 2011/0291288 A1 | 12/2011 | Wu et al. | |
| 2012/0286416 A1* | 11/2012 | Sato | H01L 21/561 |
| | | | 257/737 |
| 2013/0009307 A1 | 1/2013 | Lu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0207241 A1* | 8/2013 | Lee | H01L 23/481 |
| | | | 257/621 |
| 2013/0280861 A1* | 10/2013 | Ma | H01L 24/27 |
| | | | 257/E21.503 |
| 2013/0307140 A1 | 11/2013 | Huang et al. | |
| 2014/0021600 A1 | 1/2014 | Daubenspeck et al. | |
| 2014/0203429 A1 | 7/2014 | Yu et al. | |
| 2014/0225222 A1 | 8/2014 | Yu et al. | |
| 2014/0252594 A1 | 9/2014 | Meng et al. | |
| 2014/0252646 A1 | 9/2014 | Hung et al. | |
| 2014/0264930 A1 | 9/2014 | Yu et al. | |
| 2015/0123266 A1 | 5/2015 | Wu et al. | |
| 2015/0125993 A1 | 5/2015 | Lee et al. | |
| 2015/0162256 A1* | 6/2015 | Hsu | H01L 23/481 |
| | | | 257/774 |
| 2015/0228594 A1 | 8/2015 | Alvarado et al. | |
| 2016/0141213 A1 | 5/2016 | Bishop et al. | |
| 2016/0163578 A1 | 6/2016 | Yu et al. | |
| 2017/0005054 A1 | 1/2017 | Chiu et al. | |
| 2017/0125317 A1 | 5/2017 | Kuo et al. | |
| 2017/0250138 A1 | 8/2017 | Hsieh et al. | |
| 2018/0012837 A1* | 1/2018 | Chen | H01L 24/05 |
| 2018/0076175 A1 | 3/2018 | Hsieh et al. | |
| 2018/0122774 A1 | 5/2018 | Huang et al. | |
| 2018/0233474 A1 | 8/2018 | Yu et al. | |
| 2019/0074195 A1* | 3/2019 | Hu | H01L 21/6835 |
| 2019/0115294 A1 | 4/2019 | Lu | |
| 2019/0131262 A1 | 5/2019 | Yu et al. | |
| 2019/0189552 A1* | 6/2019 | Kelly | H01L 23/49838 |
| 2019/0326241 A1 | 10/2019 | Chen et al. | |
| 2019/0333862 A1 | 10/2019 | Wang et al. | |
| 2020/0006220 A1 | 1/2020 | Pan et al. | |
| 2020/0043842 A1 | 2/2020 | Kim et al. | |
| 2020/0091097 A1 | 3/2020 | Hung et al. | |
| 2020/0135677 A1 | 4/2020 | Chang et al. | |
| 2020/0176432 A1 | 6/2020 | Huang et al. | |
| 2021/0134750 A1 | 5/2021 | Manack et al. | |
| 2021/0175190 A1 | 6/2021 | Chen et al. | |

FOREIGN PATENT DOCUMENTS

| | | |
|---|---|---|
| CN | 101213890 A | 7/2008 |
| CN | 102867776 A | 1/2013 |
| CN | 105720038 A | 6/2016 |
| CN | 107808870 A | 3/2018 |
| CN | 109659292 A | 4/2019 |
| CN | 109671694 A | 4/2019 |
| CN | 110660753 A | 1/2020 |
| CN | 111128750 A | 5/2020 |
| CN | 111128762 A | 5/2020 |
| EP | 3038150 A1 | 6/2016 |
| KR | 20180028920 A | 3/2019 |
| KR | 20200036771 A | 4/2020 |
| TW | 201715681 A | 5/2010 |
| TW | 201618626 A | 5/2016 |
| TW | 201729364 A | 8/2017 |
| TW | 201916304 A | 4/2019 |
| TW | 202002110 A | 1/2020 |

\* cited by examiner

ECCENTRIC VIA STRUCTURES FOR STRESS REDUCTION

PRIORITY CLAIM AND CROSS-REFERENCE

This application claims the benefit of the U.S. Patent Provisional Application No. 63/053,317, filed Jul. 17, 2020, and entitled "A Novel Eccentric Structure of Stacking Via for Stress Reduction on Fan-out Structure," which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

A typical bonding structure may include an Under-Bump-Metallurgy (UBM), which is a metal pad, and a metal pillar on the UBM. A solder region may be used for bonding the metal pillar to another electrical connector of another package component.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
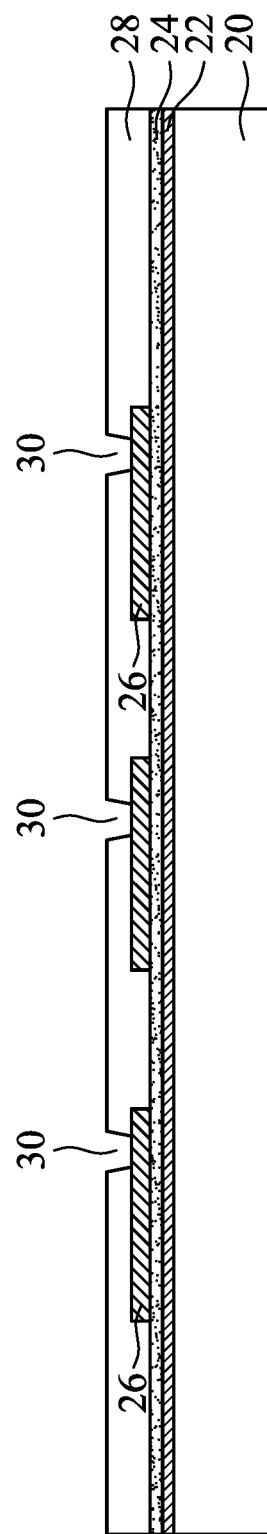
FIGS. 1 through 12 illustrate the cross-sectional views of intermediate stages in the formation of an interconnect component including eccentric bonding structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including eccentric bonding structures and the method of forming the same are provided. In accordance with some embodiments of the present disclosure, a conductive bump (which may be a metal pillar) is formed, and a conductive pad is formed underneath the conductive bump, with the conductive pad being larger than the conductive bump. A first via is underlying and joined to the conductive pad. The first via is vertically offset from the center of the overlying conductive bump. A plurality of second vias, which are underlying and electrically connected to the first via, are also offset from the first via. The offsets may prevent the vias and the pads that have high Coefficient of Thermal Extension (CTE) values from being vertically aligned, and hence may reduce the stress. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 12 illustrate the cross-sectional views of intermediate stages in the formation of an interconnect component including eccentric bonding structures in accordance with some embodiments of the present disclosure. The corresponding processes are also reflected schematically in the process flow shown in FIG. 20. It is appreciated that although the interconnect component including the eccentric bonding structures are formed starting from a carrier, it may also be formed starting from other components such as a fan-out interconnect structure of device dies, a part of a device die or an interposer, etc.

FIG. 1 illustrates carrier 20 and release film 22 formed on carrier 20. Carrier 20 may be a glass carrier, a silicon wafer, an organic carrier, or the like. Carrier 20 may have a round top-view shape in accordance with some embodiments. Release film 22 may be formed of a polymer-based material (such as a Light-To-Heat-Conversion (LTHC) material), which is capable of being decomposed under radiation such as a laser beam, so that carrier 20 may be de-bonded from the overlying structures that will be formed in subsequent processes. In accordance with some embodiments of the present disclosure, release film 22 is formed of an epoxy-based thermal-release material, which is coated onto carrier 20.

Figure 20:
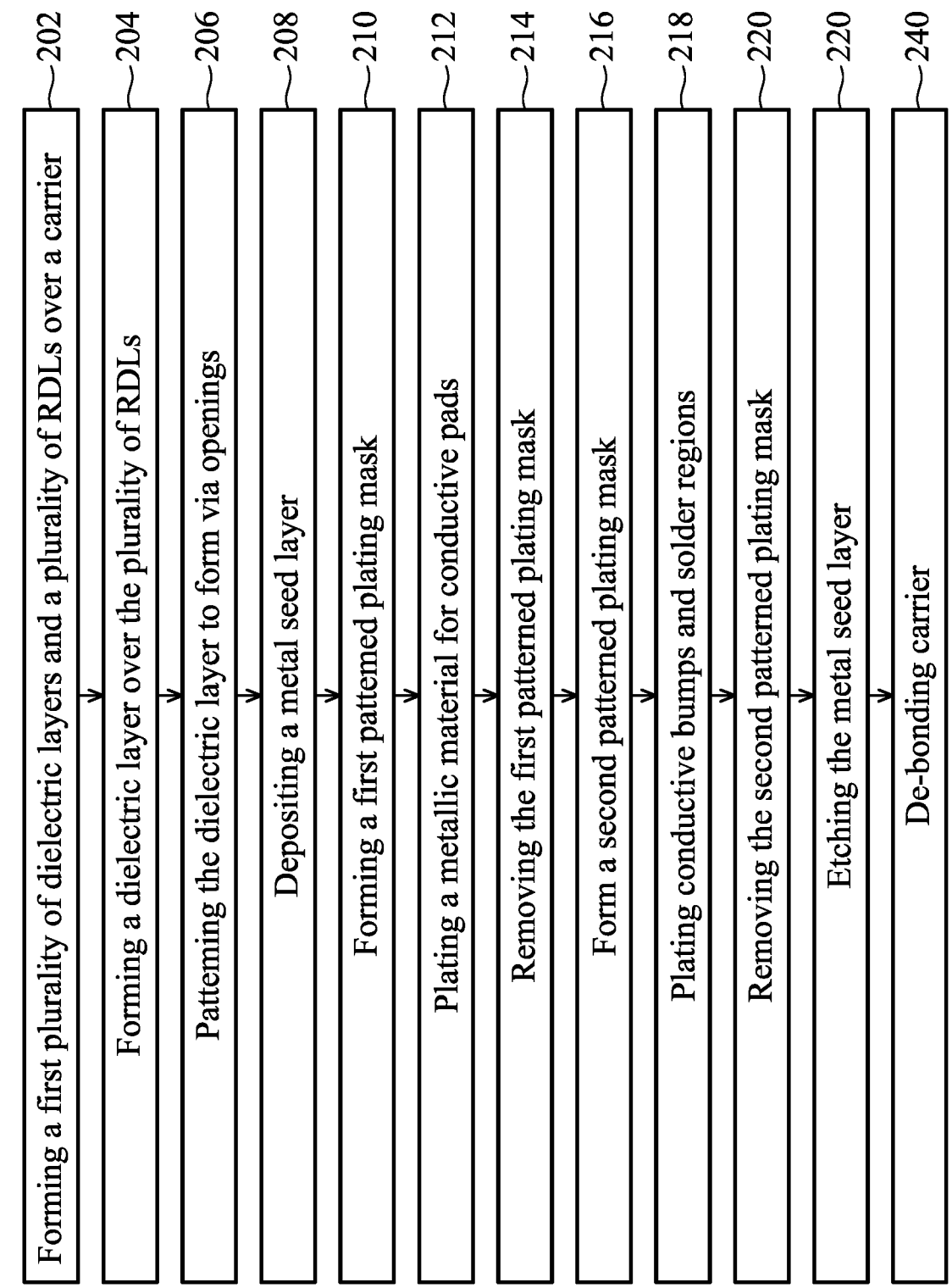
FIG. 20 illustrates a process flow for forming an interconnect component including eccentric bonding structures in accordance with some embodiments.

A plurality of dielectric layers and a plurality of RDLs are formed over the release film 22, as shown in FIGS. 1 through 4. The respective process is illustrated as process 202 in the process flow 200 as shown in FIG. 20. Referring to FIG. 1, dielectric layer 24 is first formed on release film 22. In accordance with some embodiments of the present disclosure, dielectric layer 24 is formed of a polymer, which may also be a photo-sensitive material such as polybenzoxazole (PBO), polyimide, benzocyclobutene (BCB), or the like, that may be easily patterned using a photo lithography process.

Redistribution Lines (RDLs) 26 are formed over dielectric layer 24 in accordance with some embodiments. The formation of RDLs 26 may include forming a seed layer (not shown) over dielectric layer 24, forming a patterned mask (not shown) such as a photo resist over the seed layer, and then performing a metal plating process on the exposed seed layer. The patterned mask and the portions of the seed layer covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD) or a like process. The plating may be performed using, for example, electro-less plating.

Further referring to FIG. 1, dielectric layer 28 is formed on RDLs 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. Alternatively, dielectric layer 28 may include a non-organic dielectric material such as silicon oxide, silicon nitride, silicon carbide, silicon oxynitride, or the like. Dielectric layer 28 is then patterned to form openings 30 therein. Hence, some portions of RDLs 26 are exposed through the openings 30 in dielectric layer 28.

Figure 2:
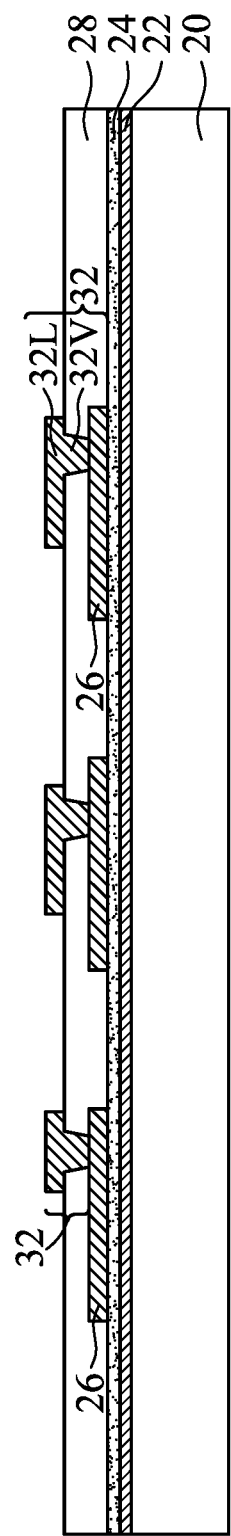

Next, referring to FIG. 2, RDLs 32 are formed to connect to RDLs 26. RDLs 32 include metal traces (metal lines) over dielectric layer 28. RDLs 32 also include vias extending into the openings 30 in dielectric layer 28. RDLs 32 may also be formed through a plating process, wherein each of RDLs 32 includes a seed layer (not shown) and a plated metallic material over the seed layer. In accordance with some embodiments, the formation of RDLs 32 may include depositing a blanket metal seed layer extending into the via openings, and forming and patterning a plating mask (such as photo resist), with opening formed directly over the via openings. A plating process is then performed to plate a metallic material, which fully fills the via openings 30, and has some portions higher than the top surface of dielectric layer 28. The plating mask is then removed, followed by an etching process to remove the exposed portions of the metal seed layer, which was previously covered by the plating mask. The remaining portions of the metal seed layer and the plated metallic material are RDLs 32.

The metal seed layer and the plated material may be formed of the same material or different materials. The metallic material in RDLs 32 may include a metal or a metal alloy including copper, aluminum, tungsten, or alloys thereof. RDLs 32 include RDL lines (also referred to as traces or trace portions) 32L and via portions (also referred to as vias) 32V, wherein trace portions 32L are over dielectric layer 28, and via portions 32V are in dielectric layer 28. Since trace portions 32L and via portions (also referred to as vias) 32V are formed in a same plating process, there is no distinguishable interface between vias 32V and the corresponding overlying trace portions 32L. Also, each of vias 32V may have a tapered profile, with the upper portions wider than the corresponding lower portions.

Figure 3:
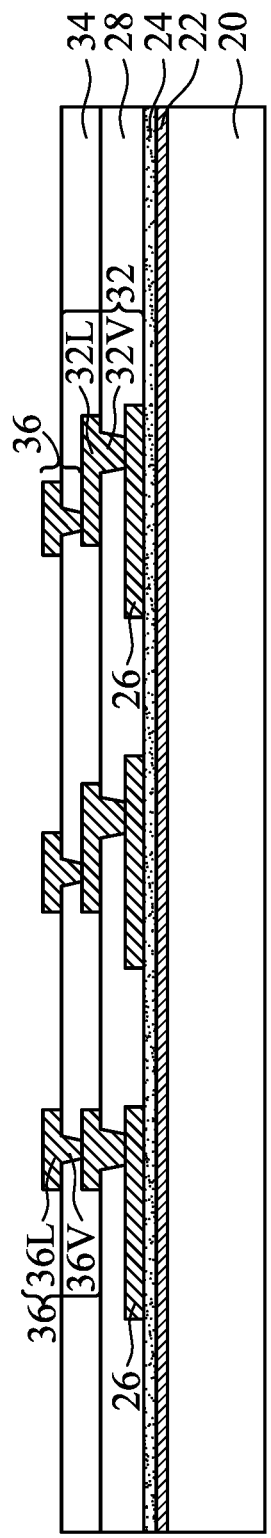

Referring to FIG. 3, dielectric layer 34 is formed over RDLs 32 and dielectric layer 28. Dielectric layer 34 may be formed using a polymer, which may be selected from the same group of candidate materials as those of dielectric layer 28. For example, dielectric layer 34 may be formed of PBO, polyimide, BCB, or the like. Alternatively, dielectric layer 34 may include a non-organic dielectric material such as silicon oxide, silicon nitride, silicon carbide, silicon oxynitride, or the like.

FIG. 3 further illustrates the formation of RDLs 36, which are electrically connected to RDLs 32. The formation of RDLs 36 may adopt the methods and materials similar to those for forming RDLs 32. RDLs 36 include the trace portions (RDL lines) 36L and via portions (vias) 36V, wherein trace portions 36L are over dielectric layer 34, and via portions 36V extend into dielectric layer 34. Also, each of vias 36V may have a tapered profile, with the upper portions wider than the corresponding lower portions.

Figure 4:
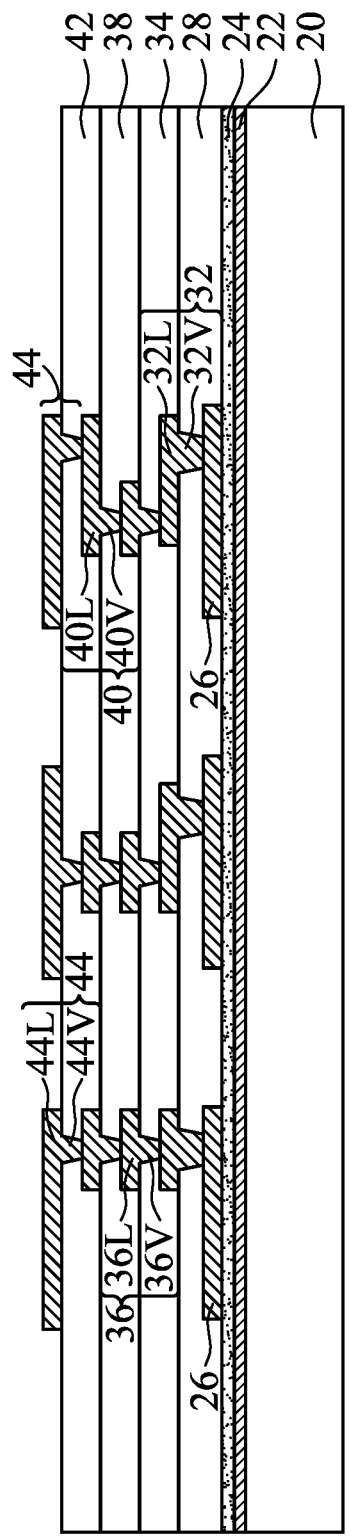

FIG. 4 illustrates the formation of dielectric layers 38 and 42 and RDLs 40 and 44. In accordance with some embodiments of the present disclosure, dielectric layers 38 and 42 are formed of materials selected from the same group of candidate materials for forming dielectric layers 34 and 28, and may include organic materials or inorganic materials, as aforementioned. It is appreciated that although in the illustrated example embodiments, four dielectric layers 28, 34, 38, and 42, and the respective RDLs 32, 36, 40, and 44 formed therein are discussed as an example, fewer or more dielectric layers and RDL layers may be adopted, depending on the routing requirement.

Figure 5:
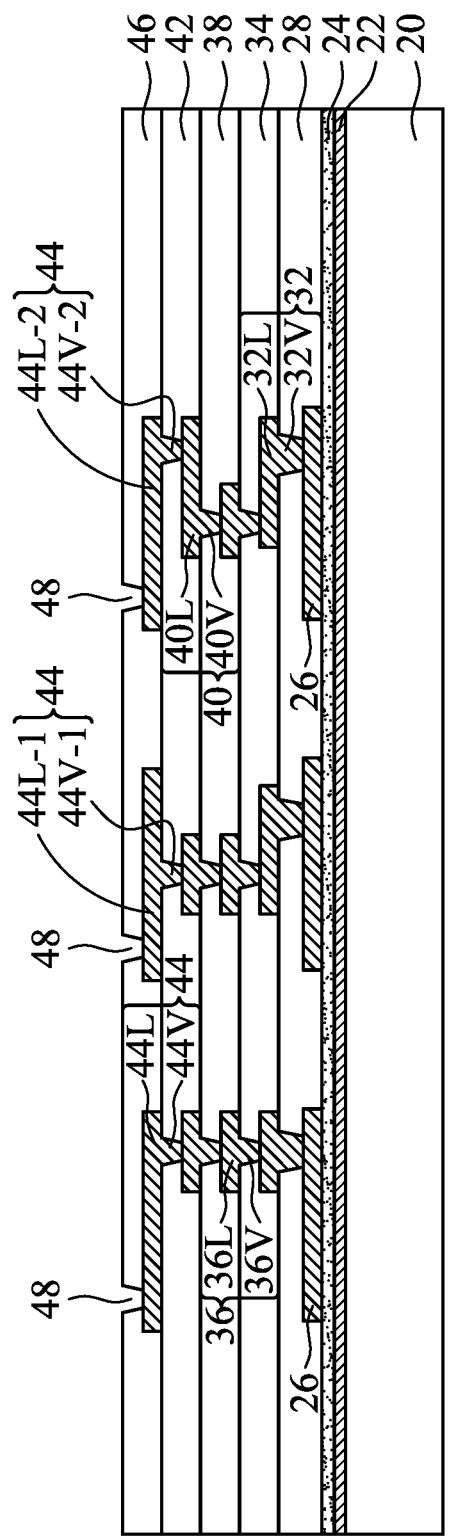

FIGS. 5 through 10 illustrate the formation of vias 56, conductive pads 58, and conductive bumps 60 (FIG. 10) in accordance with some embodiments. Referring to FIG. 5, dielectric layer 46 is formed. The respective process is illustrated as process 204 in the process flow 200 as shown in FIG. 20. In accordance with some embodiments, dielectric layer 46 is formed of a polymer, which may be a photo-sensitive material such as PBO, polyimide, BCB, or the like. Dielectric layer 46 is patterned to form via openings 48, so that the underlying pad portions of RDL lines 44L are exposed. The respective process is illustrated as process 206 in the process flow 200 as shown in FIG. 20. In accordance with some embodiments, via openings 48 are laterally offset from the respective underlying vias 44V. As shown in FIG. 5, some vias 44V (such as via 44V-1) may be aligned to the center of the overlying RDL lines 44L (such as 44L-1). Some other vias 44V may be offset from the centers of the respective overlying RDL lines 44L. For example, via 44V-2 is offset to the right side from the middle of RDL line 44L-2.

Figure 6:
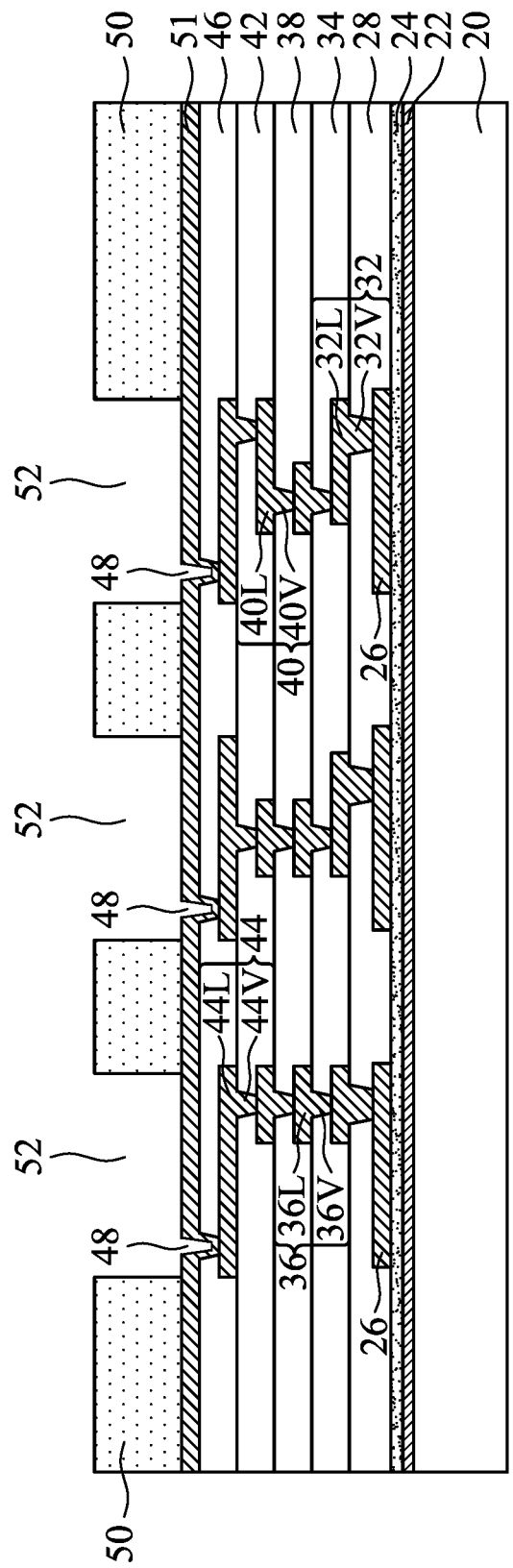

Referring to FIG. 6, metal seed layer 51 is deposited. The respective process is illustrated as process 208 in the process flow 200 as shown in FIG. 20. In accordance with some embodiments, metal seed layer 51 includes a titanium layer and a copper layer over the titanium layer. In accordance with alternative embodiments, metal seed layer 51 includes a single copper layer, which is in physical contact with dielectric layer 46. Plating mask 50 is then formed and patterned, with openings 52 being formed in plating mask 50. The respective process is illustrated as process 210 in the process flow 200 as shown in FIG. 20. Via openings 48 are under and joined with openings 52. The top-view shape of openings 52 may include circles or polygonal shapes such as hexagonal shapes, octagonal shapes, or the like.

Figure 7:
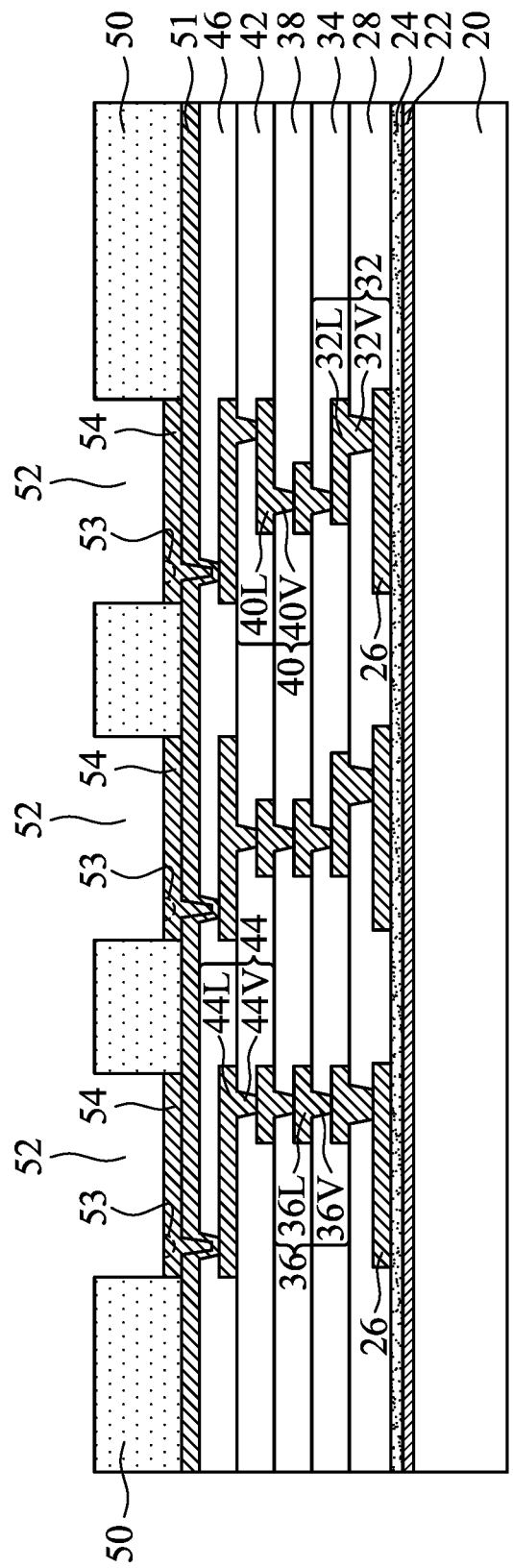

Referring to FIG. 7, metallic material 54 is deposited through a plating process. The respective process is illustrated as process 212 in the process flow 200 as shown in FIG. 20. The plating process may include electrochemical plating, electroless plating, or the like. In accordance with some embodiments, metallic material 54 comprises copper or a copper alloy. Process conditions may be adjusted, so that the top surface of the plated material 54 may be planar. In accordance with alternative embodiments, the portions of the top surfaces of metallic material 54 may have recesses, as illustrated by dashed lines 53, which recesses are formed due to the filling of via openings 48 (FIG. 7).

In subsequent processes, plating mask 50, which may be a photo resist, is removed, for example, through an ashing process. The respective process is illustrated as process 214 in the process flow 200 as shown in FIG. 20. The underlying portions of metal seed layer 51 are thus exposed.

Figure 8:
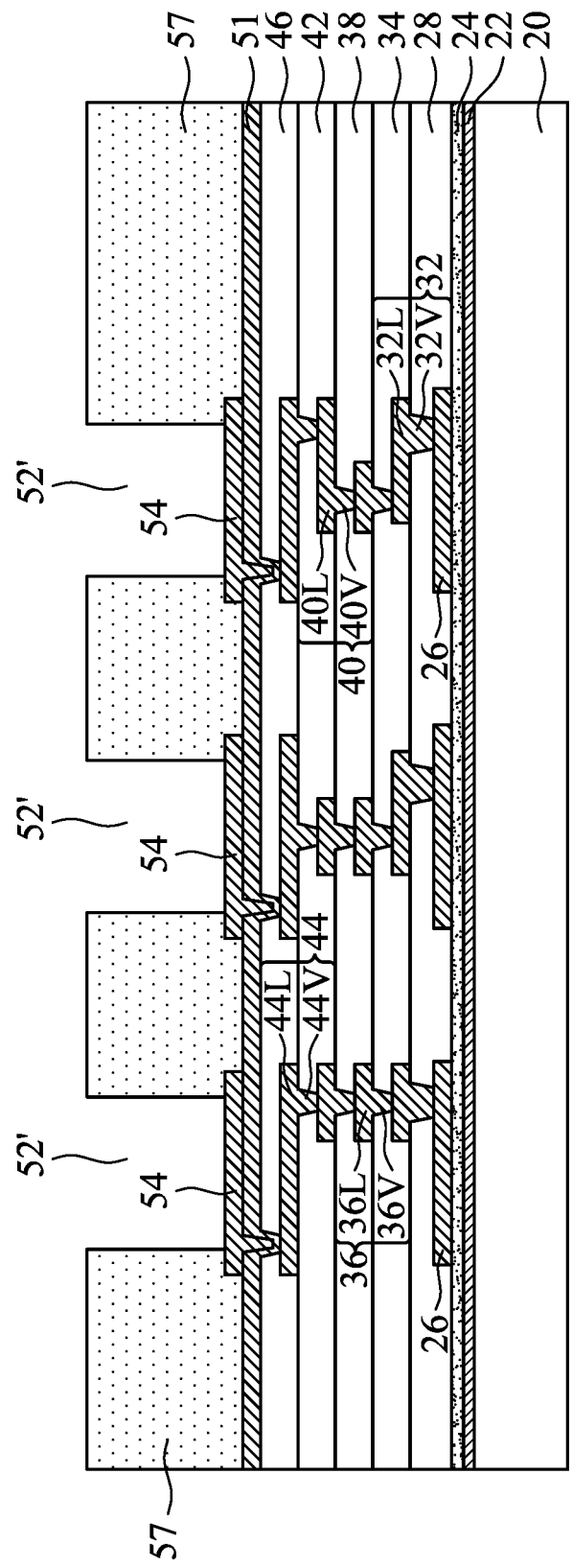
Figure 9:
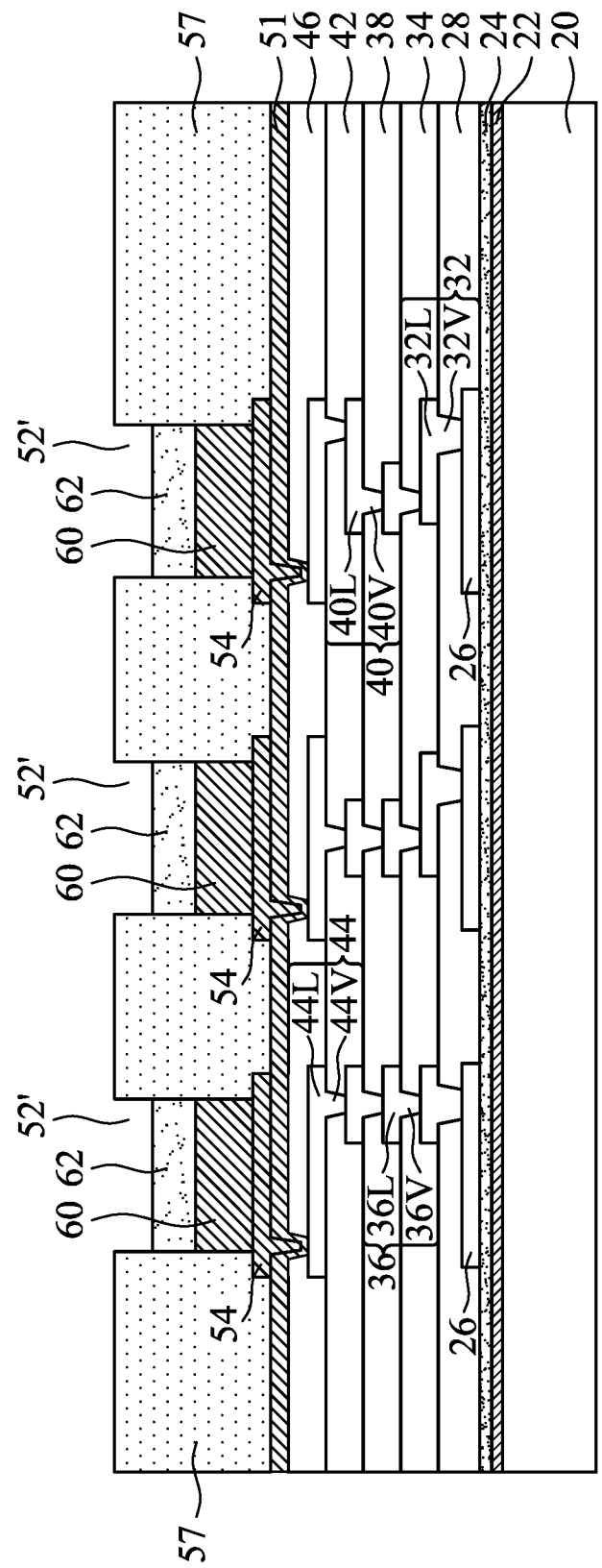
Figure 19:
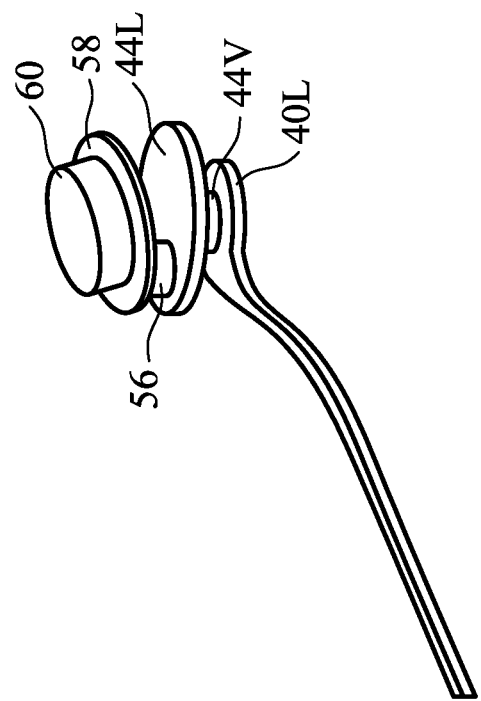
FIGS. 18 and 19 illustrate the structures that are simulated in accordance with some embodiments.

Referring to FIG. 8, without removing metal seed layer 51, plating mask 57 is formed on metal seed layer 51 and plated material 54, with openings 52' being formed to reveal the plated material 54. The respective process is illustrated as process 216 in the process flow 200 as shown in FIG. 20. Next, as shown in FIG. 9, conductive bump 60 is formed through a plating process, which may be an electrochemical plating process or an electroless plating process, for example. The respective process is illustrated as process 218 in the process flow 200 as shown in FIG. 20. The entireties of conductive bumps 60 may be formed of a homogeneous material such as copper or a copper alloy. Conductive bumps 60 and the underlying plated material 54 may have distinguishable interfaces in between, or may be merged with each other (for example, when both formed of copper) without distinguishable interface in between. Conductive bumps 60 are also referred to as metal pillars or metal rods due to their shapes. For example, FIG. 19 illustrates an example conductive bump 60, which have a round top-view shape, while other shapes such as hexagonal shapes, octagonal shapes, or the like may also be adopted, depending on the top-view shapes of openings 52'. FIG. 9 further illustrates the deposition of solder regions 62 in accordance with some embodiments, which are also deposited through plating. Solder regions 62 may be formed of or comprise AgSn, AgSnCu, SnPb, or the like. In accordance with alternative embodiments, solder regions 62 are not formed.

Figure 10:
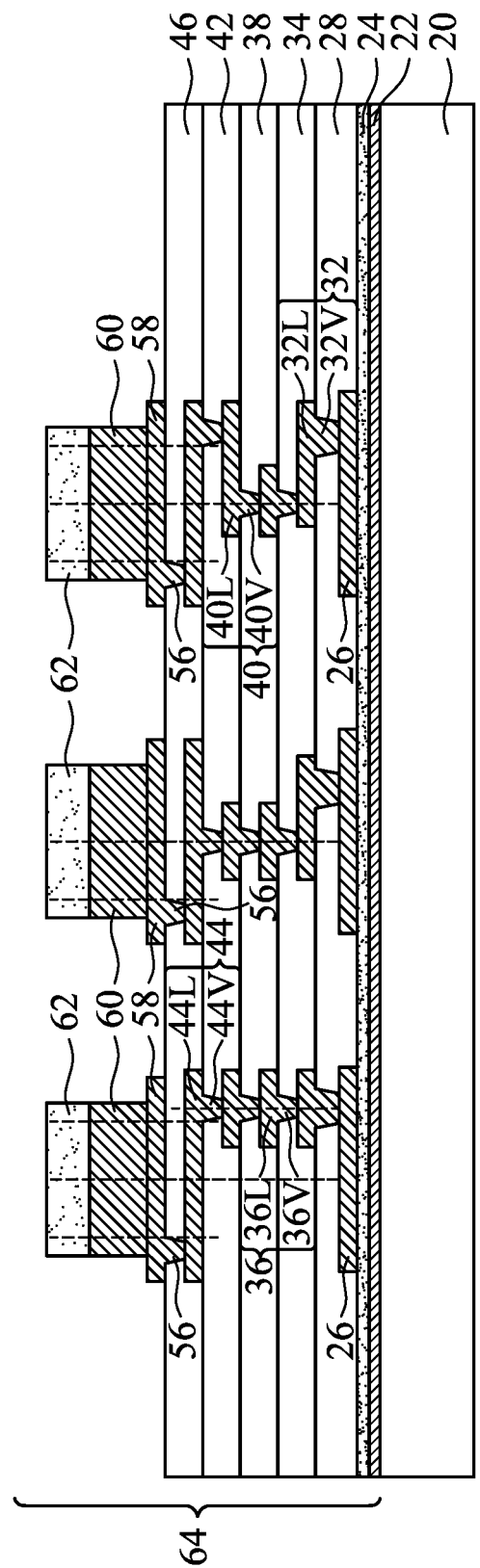

In a subsequent process, plating mask 57 is removed, for example, through ashing. The respective process is illustrated as process 220 in the process flow 200 as shown in FIG. 20. Next, an etching process, which may be a wet etching process or a dry etching process, is performed to remove the exposed portions of metal seed layer 51. The respective process is illustrated as process 222 in the process flow 200 as shown in FIG. 20. The portions of metal seed layer 51 directly under the plated metallic material 54 are left. Throughout the description, metallic material 54 and the underlying remaining portions of metal seed layer 51 are collectively referred to as vias 56 (also referred to a top vias) and conductive pads 58. The resulting structure is shown in FIG. 10. Vias 56 are the portions in dielectric layer 46, while conductive pads 58 are the portions over dielectric layer 46. Each of vias 56 and conductive pads 58 may include a remaining portion of the metal seed layer 51, and a portion of the plated material 54. Conductive bumps 60 are directly over conductive pads 58, and are laterally recessed from the edges of conductive pads 58. Alternatively stated, conductive pads 58 are larger than conductive bumps 60.

Figure 11:
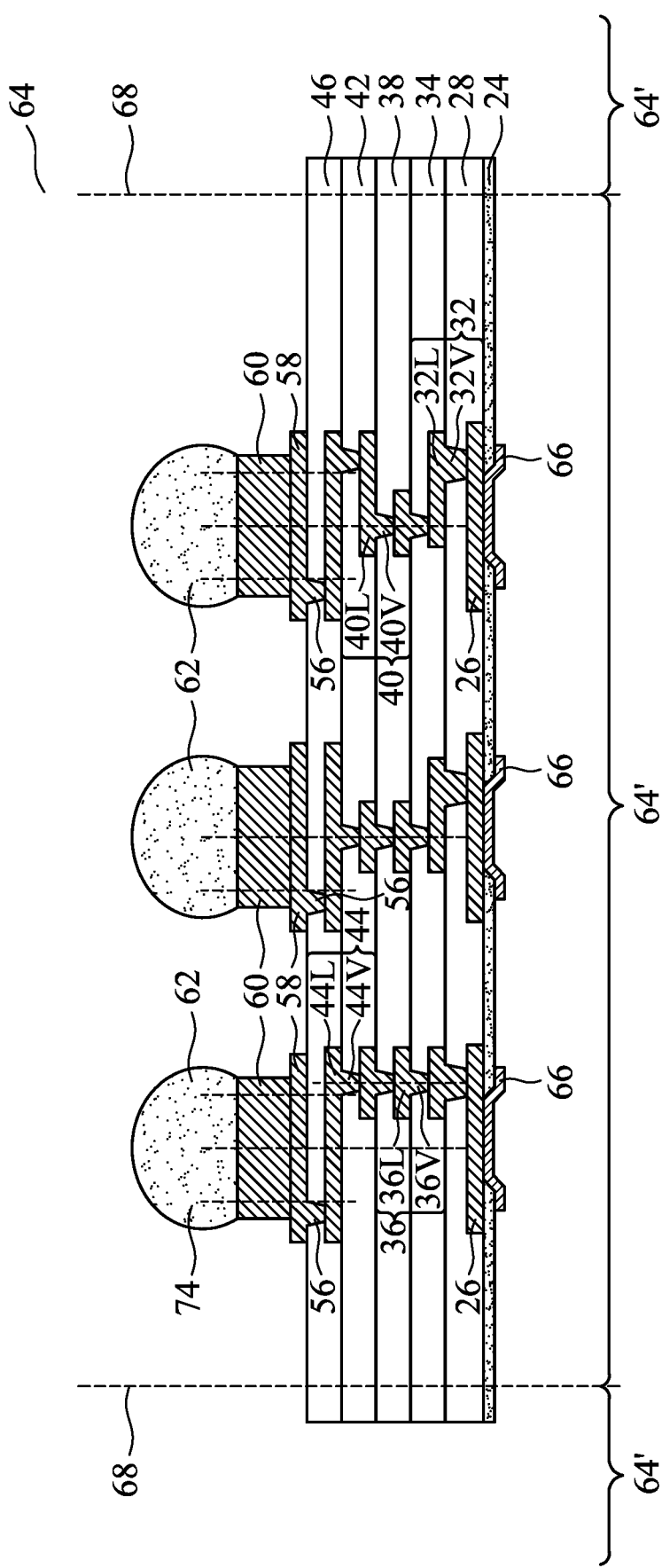

Throughout the description, the structure over release film 22 are referred to as interconnect component 64. In a subsequent process, interconnect component 64 may be placed on a frame (not shown), with solder regions 62 adhered to a tape in the frame. Interconnect component 64 is then de-bonded from carrier 20, for example, by projecting UV light or a laser beam on release film 22, so that release film 22 decomposes under the heat of the UV light or the laser beam. The respective process is illustrated as process 224 in the process flow 200 as shown in FIG. 20. Interconnect component 64 is thus de-bonded from carrier 20. The resulting interconnect component 64 is shown in FIG. 11. In the resulting structure, dielectric layer 24 may be exposed. Solder regions 62, if formed, may be reflowed to have rounded surfaces.

Further referring to FIG. 11, electrical connectors 66 are formed to electrically connect to RDLs 26. In accordance with some embodiments, electrical connectors 66 are UBMs. The formation process of UBMs 66 may also include patterning dielectric layer 24 to form openings, depositing a metal seed layer, which may include a titanium layer and a copper layer on the titanium layer, forming and patterning a plating mask, plating a conductive material, removing the plating mask, and etching the metal seed layer. In accordance with other embodiments, electrical connectors 66 are solder regions, and the formation process may include patterning dielectric layer 24 (for example, through laser drilling) to form openings, placing solder balls into the openings, and performing a reflow process to reflow the solder regions.

In a subsequent process, interconnect component 64 is sawed apart in a singulation process to form a plurality of identical interconnect components 64' (also referred to as package components 64'). The singulation process may be performed by sawing interconnect component 64 along scribe lines 68.

Figure 12:
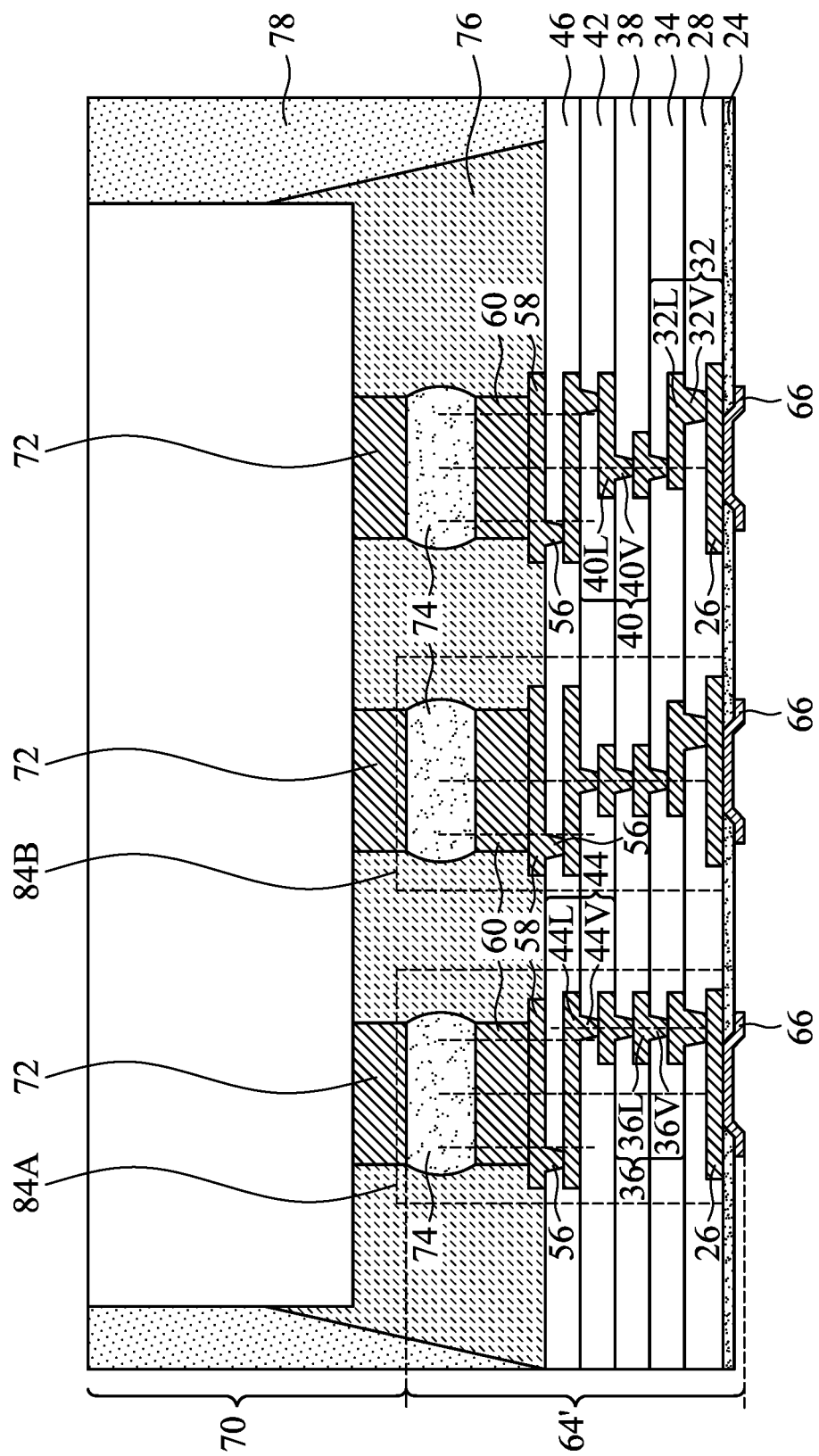

Interconnect components 64' may be used for forming packages. FIG. 12 illustrates a portion of an example structure including interconnect component 64' bonded to a package component 70. Electrical connectors 72, which are on the surface of package component 70, may be bonded to interconnect components 64' through soldered regions 74 in accordance with some embodiments. Solder regions 74 may include solder regions 62 as shown in FIG. 11. Electrical connectors 72 may be UBMs, metal pillars, bond pads, or the like. In accordance with alternative embodiments, electrical connectors 72 are metal pillars, and are bonded to conductive bumps 60 through direct metal-to-metal bonding. In accordance with these embodiments, the solder regions 62 (FIG. 11) are not formed, and conductive bumps 60 are physically joined to electrical connectors 72. In accordance with some embodiments, underfill 76 is dispensed into the gap between package component 70 and interconnect component 64'. Underfill 76 is in contact with the top surfaces and the sidewalls of the extension portions of conductive pads 58, with the extension portions being extending laterally beyond the edges of the overlying conductive bumps 60. Encapsulant 78, which may be formed of or comprise molding compound, is dispensed. A planarization process may be performed to level the top surface of package component 70 with the top surface of encapsulant 78.

Figure 13:
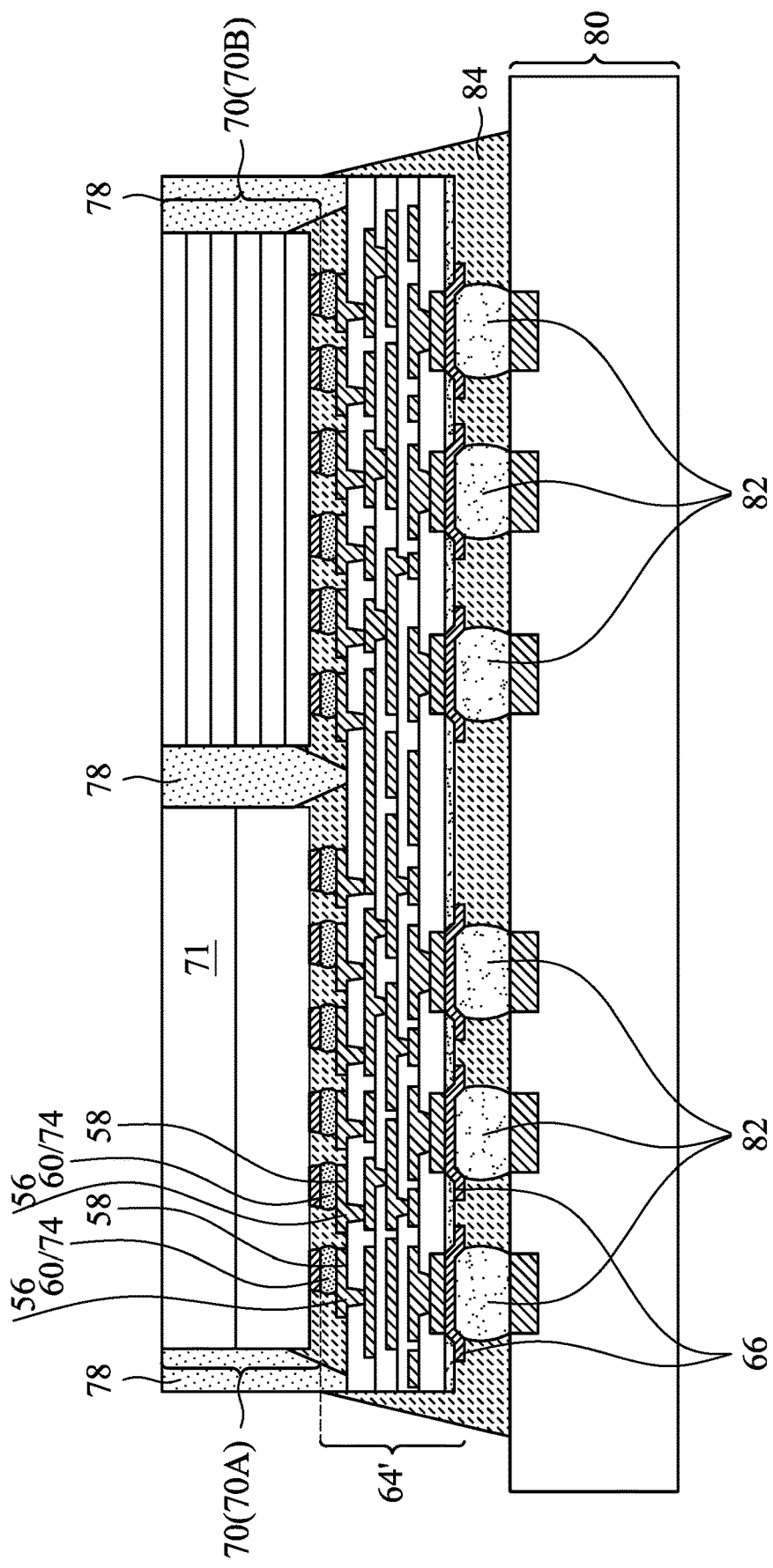
FIG. 13 illustrates a package including eccentric bonding structures in accordance with some embodiments.

FIG. 13 illustrates an application of interconnect components 64'. The structure shown in FIG. 12 may also be a part of the structure shown in FIG. 13. Each interconnect component 64' is bonded to one or a plurality of package components 70 (including 70A and 70B as an example). The details of some of the structures such as the eccentric bonding structures are not shown in detail, and the details may be found referring to FIGS. 11 and 12, and FIGS. 14-16. In accordance with some embodiments, package components 70 include a logic die, which may be a Central Processing Unit (CPU) die, a Graphic Processing Unit (GPU) die, a mobile application die, a Micro Control Unit (MCU) die, an input-output (IO) die, a BaseBand (BB) die, an Application processor (AP) die, or the like. Package components 70 may also include memory dies such as Dynamic Random Access Memory (DRAM) dies, Static Random Access Memory (SRAM) dies, or the like. The memory dies may be discrete memory dies, or may be in the form of a die stack that includes a plurality of stacked memory dies. Package components 70 may also include System-on-Chip (SOC) dies.

In accordance with some embodiments, package components 70 include package component 70A, which may be a logic die or an SOC die. In accordance with some embodiments, package component 70A includes semiconductor substrate 71 and integrated circuit devices (not shown, including transistors, for example). Package components 70 may further include package component 70B, which may be a memory die or a memory stack. Underfill 76 and molding compound 78 are also illustrated.

Interconnect component 64' is further bonded to package component 80. In accordance with some embodiments, package component 80 is or comprises an interposer, a package substrate, a printed circuit board, or the like. The bonding may be achieved through solder regions 82. Underfill 84 is dispensed between interconnect component 64' and package component 80.

Figures 14, 15:
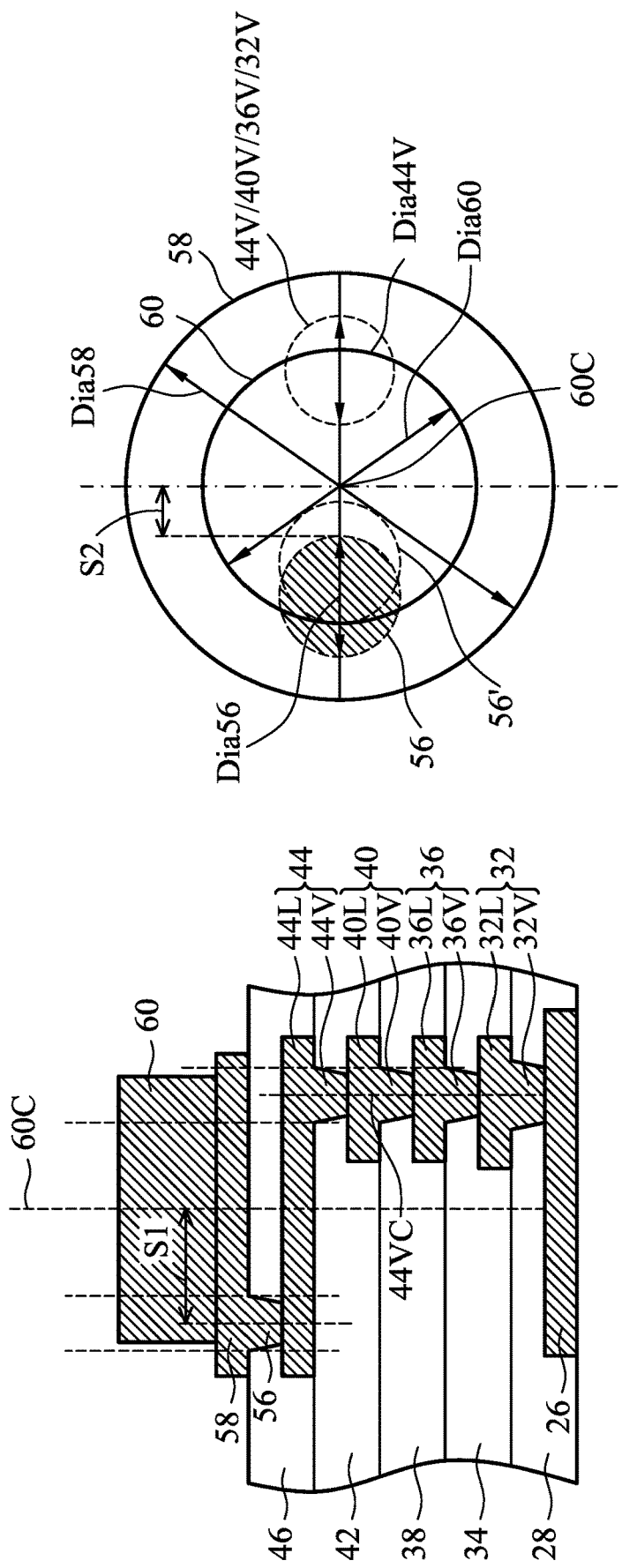
FIG. 14 illustrates the cross-sectional view of an eccentric bonding structure in accordance with some embodiments.
FIG. 15 illustrates the top view of an eccentric bonding structure in accordance with some embodiments.

FIGS. 14 and 15 illustrate a cross-sectional view and a top view, respectively, of a part of an eccentric structure in accordance with some embodiments. The illustrated part is in region 84A in FIG. 12. In accordance with some embodiments, both of conductive bump 60 and conductive pad 58 have symmetric structures. For example, FIG. 15 illustrates that conductive bump 60 and conductive pad 58 may have round top-view shapes. Conductive bump 60 and conductive pad 58 may have common center line 60C, and both of conductive bump 60 and conductive pad 58 are symmetric relative to center line 60C. In accordance with other embodiments, conductive bump 60 and conductive pad 58 may have other symmetric top-view shapes including, and not limited to, hexagonal shapes, octagonal shapes, or the like, which are also symmetric to center line 60C. Via 56 is offset from center line 60C. For example, via 56 is shifted toward left in FIG. 14. On the other hand, via 44V is offset from via 56. Vias 40V, 36V, and 32V may be vertically aligned to via 44V, or may be offset from via 44V. Throughout the description, the corresponding bonding structure is referred to as an eccentric bonding structure since the center lines of via 56 and conductive bump 60 are vertically misaligned.

In conventional structures, via 56 would have been aligned to center line 60C. This, however, results in problems. For example, conductive bump 60, conductive pad 58, and vias 44V, 40V and 36V are formed of metals, which have significantly greater Coefficient of Thermal Expansion (CTE) values than the CTE of surrounding materials such as dielectric layers 46, 42, and 38, underfill 76, and encapsulant 78. When vias 56, 44V (and possibly vias 40V and 36V) are also aligned to center line 60C, there is a high stress in the resulting structure, which may lead to delamination and trace breaking. If via 44V is moved side-way (while via 56 is aligned to center line 60C) to offset from conductive pad 58 in order to reduce the stress, the resulting structure would occupy a larger chip area. In the present disclosure, via 56 is offset from the center line 60C, so that via 44V can be offset from via 56 without incurring the area penalty, while the stress may be reduced. For example, when temperature increases, and via 56 applies a downward force to the underlying portion of RDL line 44L, due to the flexibility of RDL line 44L, the force is not transferred to via 44V (or at least an attenuated force is transferred), and hence the force, if any, will not be compounded with the force generated due to the expansion of via 44V and the underlying RDL lines and vias.

Figure 18:
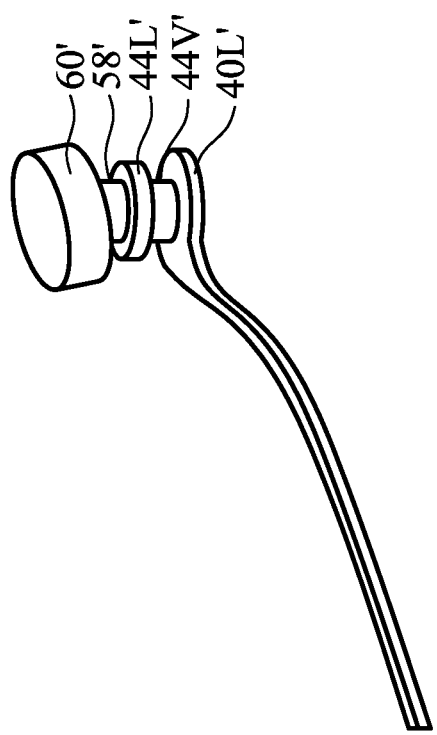

FIGS. 18 and 19 illustrate two structures, on which simulations are performed. The structure shown in FIG. 18 represents a conventional structure, which has conductive bump 60', via 56', conductive pad 58', RDL pad 44L', and via 44V' vertically aligned. The structure shown in FIG. 19 represents a structure formed in accordance with some embodiments of the present disclosure, which has conductive bump 60, conductive pad 58, via 56, RDL line 44L, and via 44V. Via 56 is offset from the center lines of conductive bump 60 and conductive pad 58. Via 44V is offset from via 56. The simulation results revealed that when the stress applied to RDL line 40L' (FIG. 18) has a normalized magnitude of 1.0, the stress applied to RDL line 40L (FIG. 19) has a normalized magnitude of 0.9, which means that the embodiments of the present disclosure has the stress reduced by 10 percent compared to conventional structures.

Referring back to FIG. 14, in accordance with some embodiments, via 56 is offset from the center line 60C of conductive bump 60 by spacing S1. The offset spacing S1 may be equal to or greater than about 8.5 µm, and may be in the range between about 8.5 µm and about 20 µm. Furthermore, is it desirable that via 56 is at least partially overlapped by conductive bump 60. For example, FIG. 14 illustrates that a right portion of via 56 is overlapped by conductive bump 60, while a left portion of via 56 extends beyond the left edge of conductive bump 60. The (at least partial) overlapping of conductive bump 60 is advantageous in allowing via 56 to support both of conductive pad 58 and conductive bump 60, and to adequately pass the stress received by via 56 from conductive pad 58 to RDL line 44L. This allows RDL line 44L to absorb an adequate amount of the stress. In accordance with alternative embodiments, as shown in FIG. 15, via 56 may be shifted slightly to the right to the position shown as 56', so that an entirety of via 56 is overlapped by conductive bump 60. For example, the left edge of via 56 may be aligned with the left edge of conductive bump 60 in accordance with some embodiments. As may be realized from FIG. 15, increasing the size of conductive pad 58 to be larger than the size of conductive bump 60 allows via 56 to shift for a desirable distance.

As shown in FIG. 14, in accordance with some embodiments of the present disclosure, via 44V is offset from both of center line 60C and via 56. Via 44V and via 56 may also offset relative to center line 60C toward opposite directions. In accordance with some embodiments, vias 56 and 44V are on the opposite sides of center line 60C, with neither via 56 nor via 44V having any portion passed-through by center line 60C. Offsetting vias 56 and 44 toward opposite directions from center line 60C may increase the distance between vias 56 and 44V, and increase the length of the portion of RDL line 44L interconnecting vias 56 and 44V. This may also increase the ability for RDL line 44L to absorb stress. In accordance with some embodiments, vias 40V, 36V, and/or 32V are vertically aligned to via 44V. In accordance with alternative embodiments, each or all of vias 40V, 36V, and/or 32V may be laterally offset from via 44V, either toward left or toward right.

In accordance with alternative embodiments, the center line 44VC of via 44V is still offset from center line 60C for a small offset amount, while via 44V is still passed-through by center line 60C. Offsetting via 44V toward an opposite direction than via 56 still results in the lateral spacing between vias 56 and 44V, and improves the stress absorption by RDL line 44L. On the other hand, via 44V may be overlapped by conductive pad 58 and conductive bump 60, so that via 44V will not occupy additional chip area (unless it needs to for signal re-routing reasons) since it occupies the same chip area occupied by conductive pad 58 and conductive bump 60.

Referring again to FIG. 15, some dimensions are marked. In accordance with some embodiment, from the top view, the lateral spacing S2 between center line 60C and the edge of via 56 may be in the range between about 4 μm and about 12 μm. The diameter Dia58 of conductive pad 58 may be in the range between about 30 μm and 50 μm The diameter Dia60 of conductive bump 60 may be in the range between about 20 μm and 40 μm. The diameters Dia56 and Dia44V may be in the range within 30 μm. In some embodiments, the diameters Dia56 and Dia44V may be in the range between about 7 μm and about 20 μm.

Figures 16, 17:
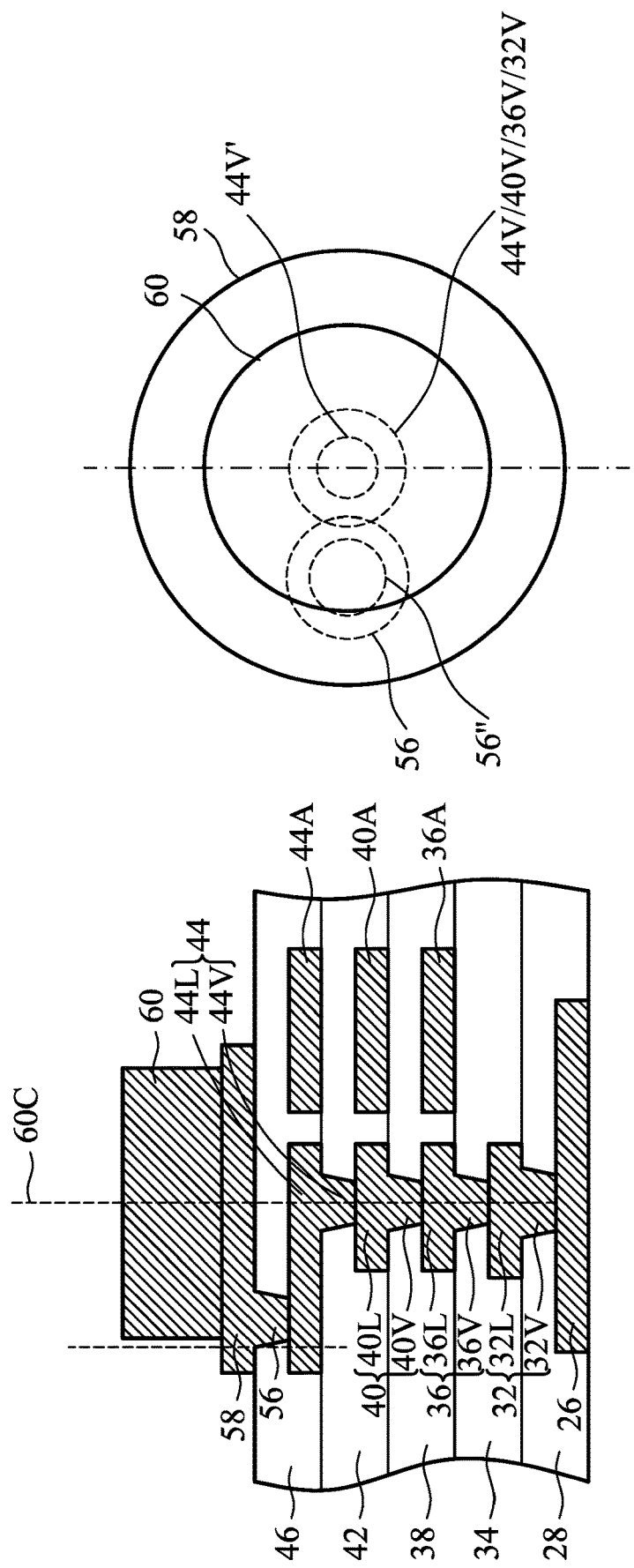
FIG. 16 illustrates the cross-sectional view of an eccentric bonding structure in accordance with some embodiments.
FIG. 17 illustrates the top view of an eccentric bonding structure in accordance with some embodiments.

FIGS. 16 and 17 illustrate a cross-sectional view and a top view, respectively, of a part of an eccentric structure in accordance with alternative embodiments. The illustrated part is in region 84B in FIG. 12. These embodiments are similar to the embodiments shown in FIGS. 14 and 15, except that the center line 44VC of via 44V is aligned to center line 60C of conductive bump 60. Each or all of vias 40V, 36V, and 32V may be vertically aligned to, or laterally offset from, via 44V, either toward left or toward right. These embodiments may be adopted when the spacing between vias 56 and 44V is large enough to provide adequate stress absorption by pad-and-trace portion 44L, for example, when the reduction is close to saturation, and when the further increase in the spacing does not result in significant reduction in the stress. With via 44V (and vias 40V and 36V) being shifted left compared to the structure as shown in FIG. 14, the right side of chip area may be provided for the routing of other RDLs (such as RDL lines 44A, 40A, and 36A, etc.).

Depending on the sizes of via 56 and via 44V, a small portion of via 44V may be overlapped by via 56, or alternatively, an entirety of via 44V is offset from via 56. The corresponding vias 56 and 44V are shown with dashed lines (FIG. 17), and are marked as vias 56" and 44V', respectively.

In the example embodiments as provided above, the eccentric bonding structures are formed in a build-up substrate. In accordance with alternative embodiments, the eccentric bonding structures may be formed in an interposer, which may include a semiconductor substrate and through-vias in the semiconductor substrate. For example, when RDLs are formed for the interposer after the backside polishing for revealing through-vias, the eccentric bonding structures may be formed as parts of the RDL structure of the interposer. In accordance with yet alternative embodiments, the eccentric bonding structures may be formed in a Chip-on-Wafer-on-Substrate (CoWoS) package, wherein the eccentric bonding structures may be formed in either or both of the wafer and the package substrate. In accordance with yet alternative embodiments, the eccentric bonding structures may be formed in a fan-out package, wherein the eccentric bonding structures may be formed in the fan-out RDLs, which are formed after the molding of device dies.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming eccentric bonding structures, the stress in the bonding structure and surrounding features is reduced. The reduction of the stress does not incur the increase in the manufacturing cost, and does not incur chip area penalty.

In accordance with some embodiments of the present disclosure, a method comprises forming a first dielectric layer; forming a first redistribution line comprising a first via extending into the first dielectric layer, and a first trace over the first dielectric layer; forming a second dielectric layer covering the first redistribution line; patterning the second dielectric layer to form a via opening, wherein the first redistribution line is revealed through the via opening; depositing a conductive material into the via opening to form a second via in the second dielectric layer, and a conductive pad over and contacting the second via; and forming a conductive bump over the conductive pad, wherein the conductive pad is larger than the conductive bump, and the second via is offset from a center line of the conductive bump. In accordance with an embodiment, the second via and the conductive pad are formed through a common plating process. In accordance with an embodiment, the second via, the conductive pad, and the conductive bump are formed using a same metal seed layer. In accordance with an embodiment, the method further includes bonding a package component over the conductive bump; and dispensing an underfill, wherein the underfill contacts a first sidewall of the conductive bump, and the underfill further contacts a top surface and a second sidewall of the conductive pad. In accordance with an embodiment, the second via comprises a first portion overlapped by the conductive bump, and a second portion extending beyond a corresponding edge of the conductive bump. In accordance with an embodiment, the first via is further offset from the center line of the conductive bump, and the first via and the second via are on opposite sides of the center line of the conductive bump. In accordance with an embodiment, the first via comprises at least a portion overlapped by the conductive bump. In accordance with an embodiment, the first via is aligned to the center line of the conductive bump.

In accordance with some embodiments of the present disclosure, a structure comprises a first dielectric layer; a first via extending into the first dielectric layer; a conductive trace over the first dielectric layer, wherein the conductive trace is over and joined to the first via; a second dielectric layer covering the conductive trace; a second via in the second dielectric layer; a conductive pad over and contacting the second via; and a conductive bump over and contacting the conductive pad, wherein the conductive pad extends laterally beyond edges of the conductive bump, and wherein the second via and the conductive bump are eccentric. In accordance with an embodiment, the conductive bump and the conductive pad have round top-view shapes. In accordance with an embodiment, the second via has a first portion overlapped by the conductive bump. In accordance with an embodiment, the second via further comprises a second portion extending beyond edges of the conductive bump. In accordance with an embodiment, the first via is aligned to a center line of the conductive bump. In accordance with an embodiment, the first via is offset from a center line of the conductive bump. In accordance with an embodiment, the first via and the second via are on opposite sides of the center line of the conductive bump, and the second via is further partially overlapped by the conductive bump.

In accordance with some embodiments of the present disclosure, a structure comprises a plurality of dielectric layers; a plurality of redistribution lines in the plurality of dielectric layers, wherein each of the plurality of redistribution lines comprises a via and a trace over and contacting the via, and the vias in the plurality of redistribution lines are stacked to form a via stack, with the vias being vertically aligned; a top via over and contacting a top trace in a top redistribution line of the plurality of redistribution lines; a conductive pad over and contacting the top via; and a conductive bump over and joined to the conductive pad, wherein the conductive pad and the conductive bump share a common center line, and the top via is offset from the common center line, with at least a portion of the top via being overlapped by the conductive bump. In accordance with an embodiment, the common center line does not pass through the top via. In accordance with an embodiment, the top via is fully overlapped by the conductive bump. In accordance with an embodiment, the top via is partially overlapped by the conductive bump. In accordance with an embodiment, the structure further includes an underfill contacting first sidewalls of the conductive bump, and second sidewalls and a top surface of the conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric layer;
    forming a first redistribution line comprising a first via extending into the first dielectric layer, and a first trace over the first dielectric layer;
    forming a second dielectric layer covering the first redistribution line;
    patterning the second dielectric layer to form a via opening, wherein the first redistribution line is revealed through the via opening;
    depositing a metal seed layer, wherein a part of the metal seed layer extends into the via opening;
    plating a conductive material into the via opening and on the metal seed layer to form a second via in the second dielectric layer, and a conductive pad over and contacting the second via;
    forming a plating mask covering and contacting the metal seed layer and a top surface of a peripheral portion of the conductive pad, wherein an additional portion of the conductive pad is exposed through the plating mask;
    plating a conductive bump over the conductive pad, wherein the conductive bump is plated using the metal seed layer, wherein the second via is offset from a center line of the conductive bump;
    removing the plating mask;
    bonding a package component over the conductive bump; and
    dispensing an underfill, wherein the underfill contacts a first sidewall of the conductive bump, and the underfill further contacts the top surface and a second sidewall of the conductive pad.

2. The method of claim 1, wherein a center of the conductive pad is vertically aligned to the center line, wherein the second via is vertically offset from the center line, and the second dielectric layer physically contacts the first dielectric layer and the first redistribution line, and wherein the method further comprises:
    before the first redistribution line is formed, forming a plurality of redistribution lines, with upper ones of the plurality of redistribution lines overlapping and physically contacting a respective lower one of the plurality of redistribution lines, each of the plurality of redistribution lines comprising a conductive trace and a conductive via underlying and joining to the conductive trace, wherein the conductive vias in the plurality of redistribution lines are vertically aligned to the first via, and wherein the first via and the conductive vias are on an opposite side of the center line than the second via.

3. The method of claim 1, wherein the second via comprises a first portion overlapped by the conductive bump, and a second portion extending beyond a corresponding edge of the conductive bump.

4. The method of claim 1, wherein the first via is further offset from the center line of the conductive bump, and the first via and the second via are on opposite sides of the center line of the conductive bump.

5. The method of claim 1, wherein the first via comprises at least a portion overlapped by the conductive bump.

6. The method of claim 5, wherein the first via is aligned to the center line of the conductive bump.

7. A structure comprising:
    a plurality of redistribution lines, with each of upper ones of the plurality of redistribution lines contacting a respective lower one of the plurality of redistribution lines, wherein each of the plurality of redistribution lines comprises:
        a metal trace; and
        a conductive via underlying and connected to the metal trace, wherein the conductive vias of the plurality of redistribution lines are vertically aligned;
    a first dielectric layer over and contacting a top redistribution line of the plurality of redistribution lines;
    a first via extending into the first dielectric layer;
    a conductive trace over the first dielectric layer, wherein the conductive trace is over and connected to the first via;
    a second dielectric layer covering and contacting the conductive trace;
    a second via in the second dielectric layer;
    a conductive pad over and contacting the second via;
    a conductive bump over and contacting the conductive pad, wherein centers of the conductive pad and the conductive bump are vertically aligned to a vertical center line, wherein the vertical center line is perpendicular to an interface between the conductive pad and the conductive bump, wherein entireties of the first via and the conductive vias of the plurality of redistribution lines are on an opposite side of the vertical center line than an entirety of the second via; and an underfill contacting both of the conductive bump and the conductive pad.

8. The structure of claim 7, wherein the conductive bump and the conductive pad have round top-view shapes.

9. The structure of claim 7, wherein the second via has a first portion overlapped by the conductive bump.

10. The structure of claim 9, wherein the second via further comprises a second portion extending beyond edges of the conductive bump.

11. The structure of claim 7, wherein the first via is at least partially overlapped by the conductive bump.

12. The structure of claim 7, wherein the first via overlaps the conductive vias of the plurality of redistribution lines.

13. The structure of claim 7, wherein the vertical center line intersects the interface, with the interface having equal widths on opposite sides of the vertical center line.

14. A structure comprising:
a plurality of dielectric layers;
a plurality of redistribution lines in the plurality of dielectric layers, wherein each of the plurality of redistribution lines comprises a via and a trace over and contacting the via, and the vias in the plurality of redistribution lines are stacked to form a via stack, with the vias being vertically aligned;
a top via over and contacting a top trace in a top redistribution line of the plurality of redistribution lines;
a conductive pad over and contacting the top via;
a conductive bump over and joined to the conductive pad to form an interface, wherein the conductive bump comprises a non-solder material, wherein the conductive pad and the conductive bump share a common center line, wherein the common center line is perpendicular to the interface, and the top via is offset from the common center line, and wherein the common center line is spaced apart from the top via, with at least a portion of the top via being overlapped by the conductive bump, and wherein the vias in the plurality of redistribution lines are on an opposite side of the common center line than the top via; and
a solder region over and contacting the conductive bump.

15. The structure of claim 14, wherein the common center line does not pass through the top via.

16. The structure of claim 14, wherein the top via is fully overlapped by the conductive bump.

17. The structure of claim 14, wherein the top via is partially overlapped by the conductive bump.

18. The structure of claim 14 further comprising an underfill contacting first sidewalls of the conductive bump, and second sidewalls and a top surface of the conductive pad.

19. The method of claim 1, wherein the conductive bump is formed through a plating process, with a plated material of the conductive bump being in physical contact with the top surface of the conductive pad.

20. The structure of claim 7, wherein the underfill is in physical contact with a sidewall of the conductive pad to form a vertical interface.

* * * * *